US009240476B2

(12) United States Patent
Pala et al.

(10) Patent No.: US 9,240,476 B2
(45) Date of Patent: Jan. 19, 2016

(54) FIELD EFFECT TRANSISTOR DEVICES WITH BURIED WELL REGIONS AND EPITAXIAL LAYERS (71) Applicant: Cree, Inc., Durham, NC (US)

(72) Inventors: Vipindis Pala, Morrisville, NC (US); Lin Cheng, Chapel Hill, NC (US); Jason Henning, Carrboro, NC (US); Anant Agarwal, Chapel Hill, NC (US); John Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 364 days.

(21) Appl. No.: 13/799,316

(22) Filed: Mar. 13, 2013

(65) Prior Publication Data

US 2014/0264579 A1    Sep. 18, 2014

(51) Int. Cl.
*H01L 29/66* (2006.01)
*H01L 29/78* (2006.01)
*H01L 21/04* (2006.01)

(52) U.S. Cl.
CPC .......... *H01L 29/7802* (2013.01); *H01L 21/045* (2013.01); *H01L 21/049* (2013.01); *H01L 29/66068* (2013.01); *H01L 21/046* (2013.01)

(58) Field of Classification Search
CPC ...................................................... H01L 29/66
See application file for complete search history.

(56) References Cited

U.S. PATENT DOCUMENTS

| 5,821,600 | A | 10/1998 | Chan |
| 5,976,936 | A | 11/1999 | Miyajima et al. |
| 6,710,403 | B2 | 3/2004 | Sapp |
| 6,974,750 | B2 | 12/2005 | Haase |
| 7,183,229 | B2 | 2/2007 | Yamanaka |
| 7,843,004 | B2 | 11/2010 | Darwish |
| 2004/0099905 | A1 | 5/2004 | Baliga |
| 2004/0166637 | A1 | 8/2004 | Ito et al. |

(Continued)

FOREIGN PATENT DOCUMENTS

| JP | 9-74191 | 3/1997 |
| JP | 2010-258386 | 11/2010 |
| JP | 2012-164707 | 8/2012 |

OTHER PUBLICATIONS

International Search Report and the Written Opinion of the International Searching Authority corresponding to International Application No. PCT/US2014/021759; Mailing Date: Jul. 7, 2014; 11 pages.

(Continued)

*Primary Examiner* — Marvin Payen
(74) *Attorney, Agent, or Firm* — Myers Bigel Sibley & Sajovec, P.A.

(57) ABSTRACT

A method of forming a transistor device includes providing a drift layer having a first conductivity type and an upper surface, forming first regions in the drift layer and adjacent the upper surface, the first regions having a second conductivity type that is opposite the first conductivity type and being spaced apart from one another, forming a body layer on the drift layer including the source regions, forming spaced apart source regions in the body layer above respective ones of the first regions, forming a vertical conduction region in the body layer between the source regions, the vertical conduction region having the first conductivity type and defining channel regions in the body layer between the vertical conduction region and respective ones of the source regions, forming a gate insulator on the body layer, and forming a gate contact on the gate insulator.

7 Claims, 6 Drawing Sheets

(56) References Cited

U.S. PATENT DOCUMENTS

| | | |
|---|---|---|
| 2004/0241950 A1 | 12/2004 | Olofsson |
| 2005/0082542 A1 | 4/2005 | Sumakeris et al. |
| 2007/0029573 A1 | 2/2007 | Cheng et al. |
| 2008/0105949 A1 | 5/2008 | Zhang et al. |
| 2008/0164520 A1 | 7/2008 | Darwish |
| 2008/0268587 A1 | 10/2008 | Sadaka et al. |
| 2009/0189228 A1 | 7/2009 | Zhang et al. |
| 2009/0206924 A1 | 8/2009 | Zeng et al. |
| 2010/0059814 A1 | 3/2010 | Loechelt et al. |
| 2010/0207198 A1 | 8/2010 | Blanchard et al. |
| 2011/0156054 A1 | 6/2011 | Takeuchi et al. |
| 2011/0241111 A1 | 10/2011 | Tamaki et al. |
| 2011/0254010 A1 | 10/2011 | Zhang |
| 2011/0298044 A1 | 12/2011 | Yagi et al. |
| 2012/0007142 A1 | 1/2012 | Nagaoka et al. |
| 2012/0187421 A1 | 7/2012 | Cheng et al. |
| 2012/0193643 A1 | 8/2012 | Masuda et al. |
| 2012/0235164 A1 | 9/2012 | Zhang et al. |
| 2012/0248462 A1 | 10/2012 | Wada et al. |
| 2012/0305943 A1 | 12/2012 | Honaga et al. |
| 2012/0313112 A1 | 12/2012 | Wada et al. |
| 2014/0015036 A1 | 1/2014 | Fursin et al. |

OTHER PUBLICATIONS

International Search Report and the Written Opinion of the International Searching Authority corresponding to International Application No. PCT/US2014/021737; Mailing Date: Jun. 20, 2014; 9 pages.

International Search Report and the Written Opinion of the International Searching Authority corresponding to International Application No. PCT/US2014/021781; Mailing Date: Jun. 26, 2014; 9 pages.

PCT International Preliminary Report on Patentability corresponding to PCT International Application No. PCT/US2014/021759, mailed Sep. 24, 2015 (11 pages).

PCT International Preliminary Report on Patentabiilty corresponding to PCT International Application No. PCT/US2014/021737, mated Sep. 24, 2015 (9 pages).

FIELD EFFECT TRANSISTOR DEVICES WITH BURIED WELL REGIONS AND EPITAXIAL LAYERS

CROSS REFERENCE TO RELATED APPLICATION

The present application is related to U.S. application Ser. No. 13/798,919, entitled "FIELD EFFECT TRANSISTOR DEVICES WITH REGROWN LAYERS,", U.S. application Ser. No. 13/799,049, entitled "FIELD EFFECT TRANSISTOR DEVICES WITH PROTECTIVE REGIONS,", and U.S. application Ser. No. 13/799,142, entitled "FIELD EFFECT TRANSISTOR DEVICES WITH BURIED WELL PROTECTION REGIONS,", all of which are filed concurrently herewith. The disclosures of each of the foregoing applications are incorporated herein by reference in their entirety.

FIELD OF THE INVENTION

The present invention relates to electronic devices and fabrication methods. More particularly, the present invention relates to high power insulated gate transistors and fabrication methods.

BACKGROUND

Power semiconductor devices are widely used to regulate large current, high voltage, and/or high frequency signals. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening silicon dioxide insulator. Current conduction occurs via transport of majority carriers, without the presence of minority carrier injection that is used in bipolar transistor operation.

MOSFETS can be formed on a silicon carbide (SiC) layer. Silicon carbide (SiC) has a combination of electrical and physical properties that make it attractive as a semiconductor material for high temperature, high voltage, high frequency and/or high power electronic circuits. These properties include a 3.2 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide-based MOSFET power devices to operate at higher temperatures, higher power levels, higher frequencies (e.g., radio, S band, X band), and/or with lower specific on-resistance and/or higher blocking voltages than silicon-based MOSFET power devices. A power MOSFET fabricated in silicon carbide is described in U.S. Pat. No. 5,506,421 to Palmour entitled "Power MOSFET in Silicon Carbide" and assigned to the assignee of the present invention.

Although silicon carbide is theoretically capable of sustaining high reverse voltages, it may be desirable to shield certain portions or features of a silicon carbide device, such as the gate insulator, the device edge, etc., from high electric fields, as breakdown may be more likely to occur at these locations.

SUMMARY

A method of forming a transistor device includes providing a drift layer having a first conductivity type, the drift layer having an upper surface, forming first regions in the drift layer and adjacent the upper surface thereof, the first regions having a second conductivity type that is opposite the first conductivity type and being spaced apart from one another, forming a body layer on the drift layer including the source regions, the body layer having the second conductivity type, forming spaced apart source regions in the body layer above respective ones of the first regions, forming a vertical conduction region in the body layer between the source regions, the vertical conduction region having the first conductivity type and defining channel regions in the body layer between the vertical conduction region and respective ones of the source regions, forming a gate insulator on the body layer, and forming a gate contact on the gate insulator.

The first regions are more heavily doped than the body layer.

The vertical conduction region is more heavily doped than the drift layer.

The method may further include forming respective body contact regions through the body layer to the first regions, the body contact regions having the second conductivity type and being more heavily doped than the body layer.

The vertical conduction region extends through the body layer to the drift layer and contacts the first regions.

A method of forming a transistor device according to some embodiments includes providing a drift layer having a first conductivity type, the drift layer having an upper surface, forming first regions in the drift layer and adjacent the upper surface thereof, the first regions having a second conductivity type that is opposite the first conductivity type and being spaced apart from one another, forming a vertical conduction layer on the drift layer including the source regions, the vertical conduction layer having the first conductivity type, forming spaced apart body regions in the vertical conduction layer above respective ones of the first regions, the body regions having the second conductivity type and defining a vertical conduction region between the body regions, forming source regions in the vertical conduction layer, wherein the source regions have the first conductivity type and define channel regions in the body regions between the vertical conduction region and respective ones of the source regions, forming a gate insulator on the body layer, and forming a gate contact on the gate insulator.

The drift layer includes a more heavily doped surface layer at an upper surface therein, wherein the first regions are formed in the more heavily doped surface layer of the drift layer.

The more heavily doped surface layer has a greater thickness than the first regions.

The first regions are formed by ion implantation at an implant energy of less than about 360 keV.

The first regions are more heavily doped than the body regions.

The vertical conduction region is more heavily doped than the drift layer.

The method may further include forming respective body contact regions through the vertical conduction layer to the first regions, the body contact regions having the second conductivity type and being more heavily doped than the body layer.

A transistor device according to some embodiments includes a drift layer having a first conductivity type, the drift layer having an upper surface, first regions in the drift layer and adjacent the upper surface thereof, the first regions having a second conductivity type that is opposite the first conductivity type and being spaced apart from one another, a body layer on the drift layer including the first regions, the body layer having the second conductivity type, spaced apart source regions in the body layer above respective ones of the first regions, and a vertical conduction region in the body layer between the source regions, the vertical conduction region having the first conductivity type and defining channel regions in the body layer between the vertical conduction region and respective ones of the source regions. The first regions are laterally spaced apart from one another by a first distance and the body regions are laterally spaced apart from one another by a second distance that is greater than the first distance.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Some embodiments of the invention provide silicon carbide (SiC) insulated gate devices that are suitable for high power and/or high temperature applications.

FIGS. 1A to 1E are cross sectional views illustrating some operations in the fabrication of a conventional power MOSFET device.

Figure 1A:
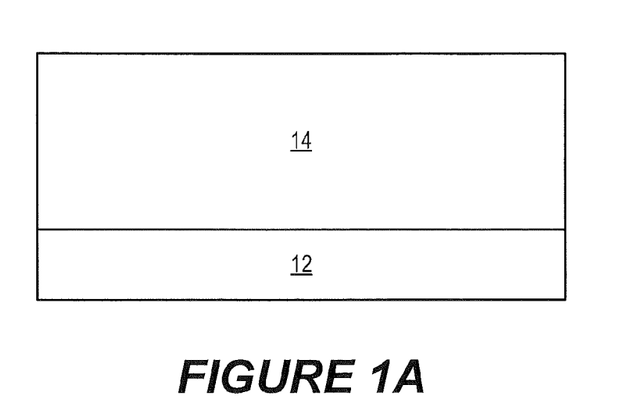
FIGS. 1A to 1E are cross sectional views illustrating the fabrication of a power MOSFET device according to conventional operations.

Referring to FIG. 1A, a substrate 12 is provided. The substrate 12 may, for example, be an n+8° off-axis 4H SiC substrate.

An n-type drift layer 14 is formed on the substrate 12. The drift layer 14 may have a thickness of about 6 μm to 10 μm, and may be doped with n-type dopants, such as nitrogen or phosphorus, at a doping concentration of about $2 \times 10^{14}$ cm$^{-3}$ to about $1 \times 10^{16}$ cm$^{-3}$.

Figure 1B:
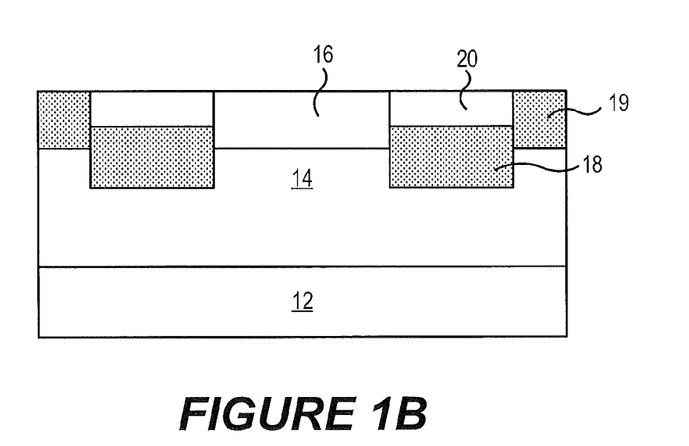

Referring to FIG. 1B, buried well regions 18 may be formed in the drift layer 14 by selective implantation of p-type dopant ions 13, such as aluminum ions, into the drift layer 14.

Well contact regions 19 are formed by ion implantation into the structure on a side of the epitaxial region opposite the substrate 12. The well contact regions 19 may be formed to extend into the buried well regions 18.

Source regions 20 are formed above the buried well regions 18. The source regions 20 may be doped with n-type dopants at a doping concentration of about $1 \times 10^{18}$ cm$^{-3}$ to about $1 \times 10^{21}$ cm$^{-3}$. The source regions 20 may be formed by ion implantation.

Still referring to FIG. 1B, a vertical conduction region 16 is formed in the drift layer 14 between the source regions 20. The vertical conduction region is doped with n-type dopants with a higher doping concentration than the drift layer 14. The vertical conduction region (sometimes referred to as a JFET, or junction field effect transistor, region) region refers to an n-type region between p-type body regions 22 (FIG. 1C) in which vertical conduction occurs during forward operation. When a reverse drain-source bias is applied to the device, a depletion region in the JFET/vertical conduction region expands to protect the MOS channel from high reverse voltages.

Figure 1C:
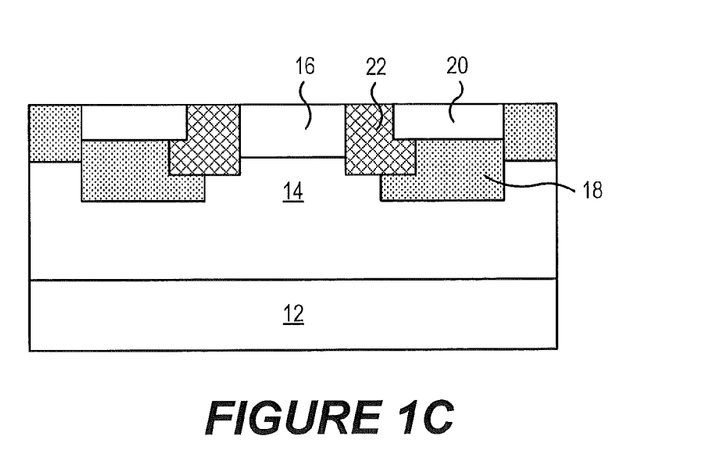

Referring to FIG. 1C, body regions 22 are formed on the drift layer 14 between the source regions 20 and the vertical conduction region 16.

The implanted dopants may be activated by annealing.

Figure 1D:
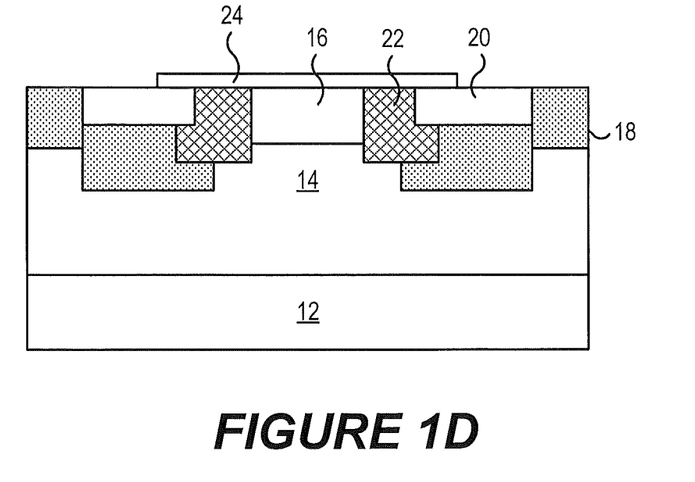

Referring to FIG. 1D, an n-type epitaxial channel layer 24 may be formed by epitaxial regrowth over the body regions 22 and the vertical conduction region 16. The n-type epitaxial channel layer 24 may be formed to extend onto the source regions 20.

Figure 1E:
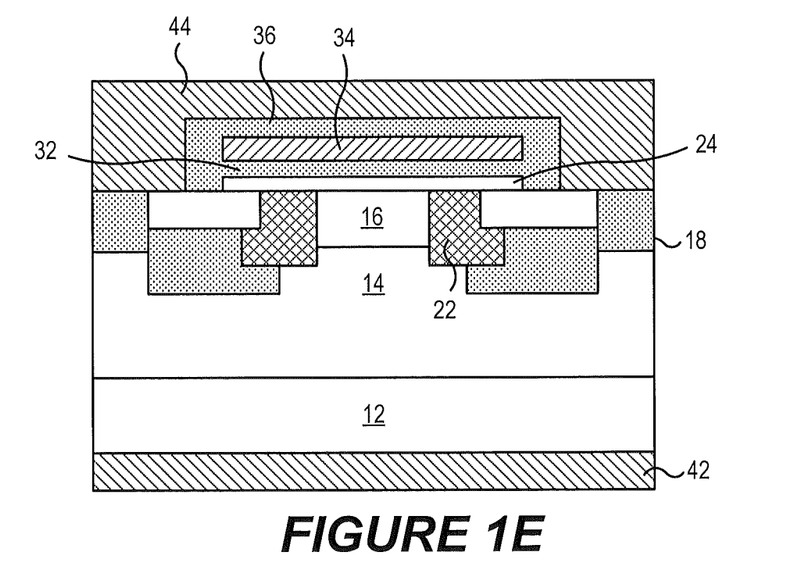

Referring to FIG. 1E, a gate insulator 32 is formed on the surface of the device over the channel layer 24 by a gate oxidation process, with a final gate oxide thickness of 400-600 Å.

After formation of the gate insulator 32, a polysilicon gate 34 may be deposited on the gate insulator 32 and doped, for example, with boron or phosphorus. An interlayer insulation layer 36 of, for example, silicon oxide or silicon nitride is formed on the gate 34. Ni may be deposited as the n-type source ohmic contact 44 and the drain ohmic contact 42. The contacts may be sintered in using a rapid thermal anneal process (RTA).

Using conventional fabrication processes, the MOS channel is defined by high energy deep p-type implants into the drift layer. These implants may create significant damage on the surface of the drift layer, reducing the electron mobility at the interface. Other techniques, such as regrowth of a light n-type epitaxial channel layer, such as the layer 24 described above, may be required to regain electron mobility in the channel. However, this may reduce the threshold voltage of the device by a considerable amount.

In addition, the high energy implants may have a significant lateral straggle, which makes it difficult to define channel lengths, e.g., on the order of 0.5 microns or shorter. The lateral straggle of implants also makes it harder to achieve good tolerances when the JFET gap between the body regions 22 is small. Smaller JFET gaps are advantageous to reduce the electric fields experienced at the semiconductor-oxide interface under reverse blocking conditions.

Some embodiments of the present inventive concepts provide methods of fabricating a MOSFET structure without the use of high energy p-type implants. This may facilitate the formation of a channel region with higher mobility because of the absence of implant damage. The ability to eliminate an n-type regrown epitaxial channel layer may also result in a higher threshold voltage with a corresponding reduction in leakage current.

Furthermore, in some embodiments, the channel length may be defined by low energy p-type implants, resulting in reduced implant straggle and better control over channel length. Box-like implant profiles may also be used, providing tighter control over the JFET gap.

FIGS. 2A to 2E are cross sectional views illustrating some operations in the fabrication of a power MOSFET device according to some embodiments.

Figure 2A:
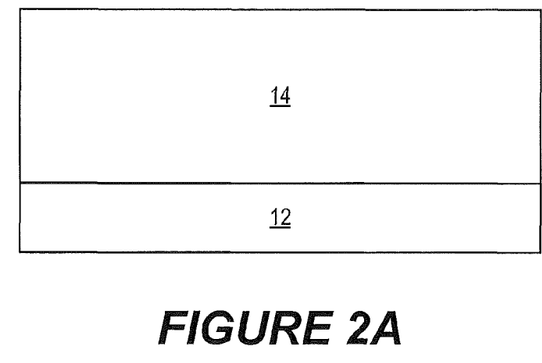
FIGS. 2A to 2E are cross sectional views illustrating the fabrication of a power MOSFET device according to some embodiments.

Referring to FIG. 2A, a substrate 12 is provided. The substrate 12 may be an off-axis SiC substrate having the 2H, 4H, 6H, 3C or 15R polytype. In particular embodiments, the substrate 12 may be an n+8° off-axis 4H SiC substrate.

A drift layer 14 is formed on the substrate 12. The drift layer 14 may have a thickness of about 6 μm to 10 μm, and may be doped with n-type dopants, such as nitrogen or phosphorus, at a doping concentration of about $2\times10^{14}$ cm$^{-3}$ to about $1\times10^{16}$ cm$^{-3}$. Other doping concentrations/voltage blocking ranges are also possible. In particular embodiments, the substrate may include a 4° off-axis 4H—SiC substrate and the drift layer may have a thickness of about 10 μm and may be doped with dopants at a doping concentration of about $8\times10^{15}$ cm$^{-3}$.

Figure 2B:
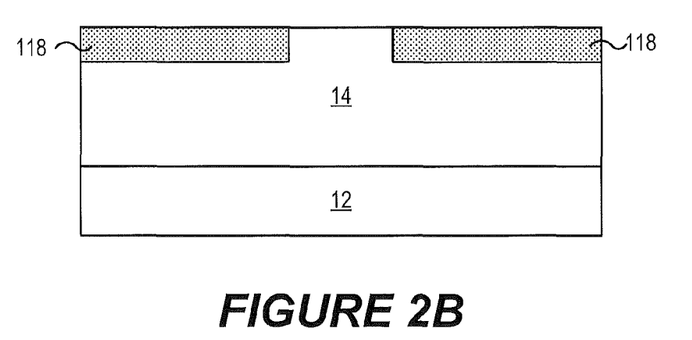

Referring to FIG. 2B, well regions 118 may be formed at the surface of the drift layer 14 by low-energy implantation of p-type dopant ions, such as aluminum and/or boron ions, into the drift layer 14. The p-type dopant ions may be implanted to have a uniform or non-uniform doping profile, such as a graded doping profile. The p-type dopant ions may be implanted at an implant energy of 200 keV and a dose of $1\times10^{15}$ cm$^{-2}$, such that the well regions 118 may have a doping concentration of about 1E18 cm$^{-3}$ to about 1E21 cm$^{-3}$.

Figure 2C:
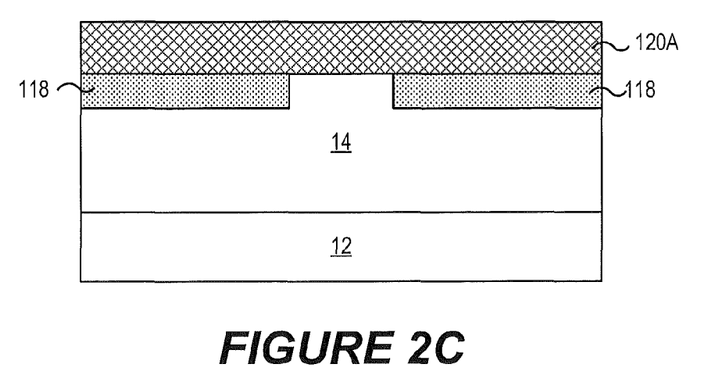

Referring to FIG. 2C, a body epitaxial layer 120A is formed on the drift layer 14 and over the well regions 118. The body epitaxial layer 120A may be doped with p-type dopants at a doping concentration of about $5\times10^{16}$ cm$^{-3}$ to about $5\times10^{17}$ cm$^{-3}$, and may have a thickness of about 0.25 μm to about 1 p.m.

Figure 2D:
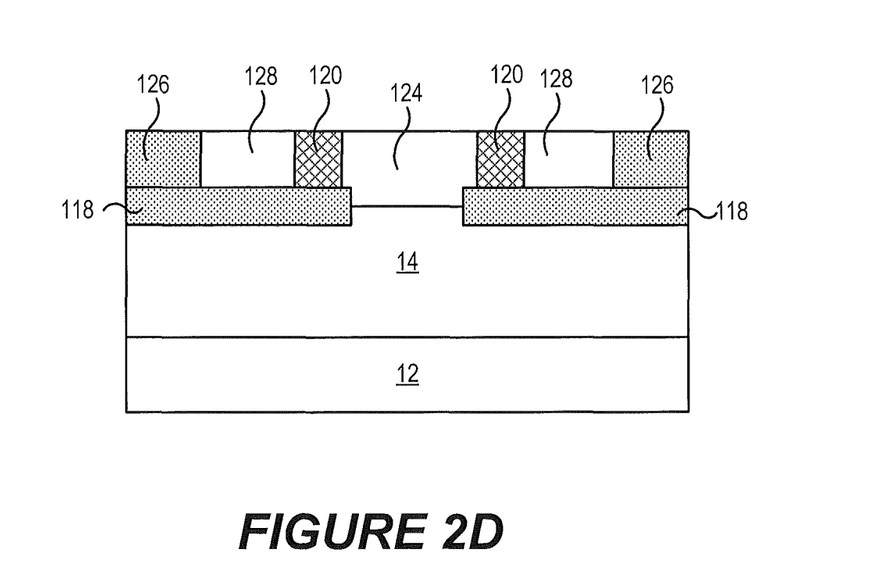

Referring to FIG. 2D, well contact regions 126, source regions 128 and a vertical conduction region 124 are formed by ion implantation into the body epitaxial layer 120A.

The well contact regions 126 may be formed to extend into the well regions 118. The well contact regions 126 may be formed using a multiple implant profile including implants having a dose of $1\times10^{15}$ cm$^{-2}$ and an implant energy of from 200 to 300 keV, resulting in a doping concentration of about $1\times10^{18}$ cm$^{-3}$ to about $1\times10^{19}$ cm$^{-3}$.

The source regions 128 are formed above the well regions 118. The source regions 128 may be doped with n-type dopants at a doping concentration of about $1\times10^{18}$ cm$^{-3}$ to about $1\times10^{21}$ cm$^{-3}$, and may have a thickness of about 0.1 μm to about 1 μm. The source regions 128 may be formed by ion implantation. The doping profile in the source regions 128 may be uniform in some embodiments. In other embodiments, the doping profile in the source regions 128 may have a gradient and/or a delta doping profile.

The vertical conduction region 124 is formed in the body epitaxial layer 120A between the source regions 128. The vertical conduction region 124 is doped with n-type dopants with a higher doping concentration than the drift layer 14. The vertical conduction region 124 may be formed, for example, by implantation of n-type impurity atoms at a dose of $2.5\times10^{12}$ cm$^{-2}$ and an implant energy of from 200 to 300 keV, resulting in a doping concentration of about $1\times10^{16}$ to about $1\times10^{17}$ cm$^{-3}$.

After implantation of the source regions 128 and the well contact regions 126, body regions 120 remain in the structure between the source regions 128 and the vertical conduction region 124.

The implanted dopants may be activated by annealing the structure at a temperature of about 1600° C. with a silicon over pressure and/or covered by an encapsulation layer such as a graphite film. A high temperature anneal may damage the surface of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 μm. The graphite coating may be heated to form a crystalline coating on the drift layer 14. The implanted ions may be activated by a thermal anneal that may be performed, for example, in an inert gas at a temperature of about 1600° C. or greater. In particular the thermal anneal may be performed at a temperature of about 1600° C. in argon for 5 minutes. The graphite coating may help to protect the surface of the drift layer 14 during the high temperature anneal.

The graphite coating may then be removed, for example, by ashing and thermal oxidation.

Figure 2E:
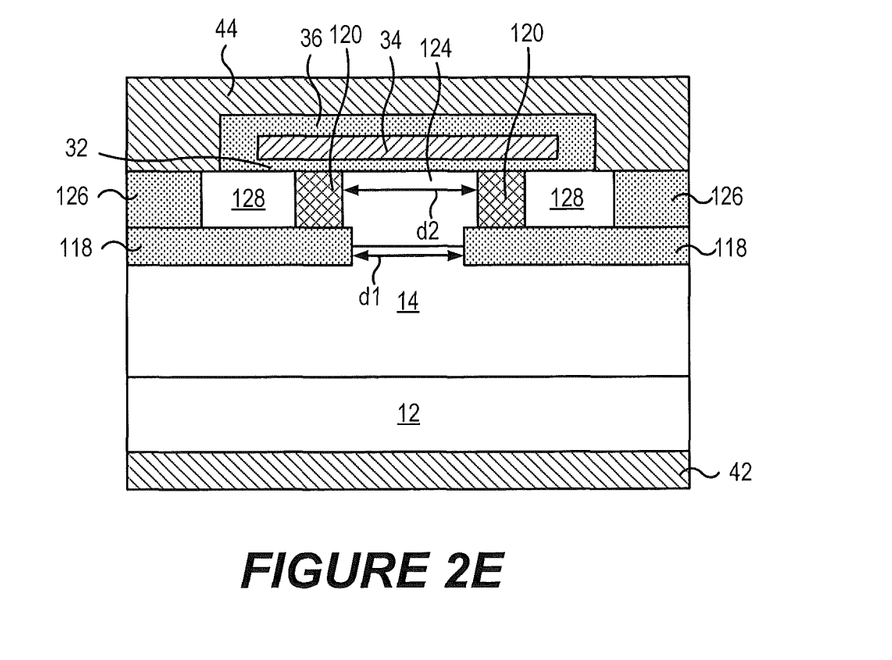

Referring to FIG. 2E, a gate insulator 32 is formed on the surface of the device by a gate oxidation process, with a final gate oxide thickness of 400-600 Å.

In particular, the gate insulator 32 may be formed using an annealed high temperature or a PECVD deposition process.

As seen in FIG. 2E, in a transistor structure formed in accordance with some embodiments, the well regions 118 are laterally spaced apart from one another by a first distance d1 and the body regions 120 are laterally spaced apart from one another by a second distance d2 that is greater than first distance. Accordingly, the on resistance of the device may be defined by the spacing between the well regions 118, which may provide tighter control over the forward resistance of the device. In addition, this configuration may help to better protect the channel regions from high electric fields in reverse blocking conditions.

In some embodiments, an oxide layer may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting gate oxide layer may have a thickness of about 500 Å.

In some embodiments, the dry $O_2$ oxide growth may be performed at a temperature of about 1175° C. in dry $O_2$ for about 4 hours. The resulting oxide layer may be annealed at a temperature of up to about 1175° C. in an inert atmosphere. In particular, the resulting oxide layer may be annealed at a temperature of about 1175° C. in Ar for about a time duration ranging from 30 min to 2 hours. Then the oxide layer receives an anneal in NO ambient at a temperature ranging from 1175° C. to 1300 C, for a duration ranging from 30 minutes to 3 hours. The resulting gate oxide layer may have a thickness of about 500 Å.

After formation of the gate insulator 32, a polysilicon gate 34 may be deposited on the gate insulator 32 and doped, for example, with boron or phosphorus. An interlayer insulation layer 36 of, for example, silicon oxide or silicon nitride is formed on the gate 34.

Ni may be deposited as the n-type source ohmic contact 44 and the drain ohmic contact 42. The contacts may be sintered in using a rapid thermal anneal process (RTA).

In the embodiments illustrated in FIGS. 2A to 2E, well regions are implanted using low energy implantation into a drift layer. A body layer is grown as a p-type epitaxial layer via epitaxial regrowth, and a vertical conduction region is implanted into the body epitaxial layer.

FIGS. 3A to 3E are cross sectional views illustrating some operations in the fabrication of a power MOSFET device according to further embodiments. In contrast to the embodiments of FIGS. 2A to 2E, in the embodiments illustrated in FIGS. 3A to 3E, a vertical conduction region is grown as an epitaxial layer via epitaxial regrowth, and body regions are formed in the epitaxial layer by ion implantation.

Figure 3A:
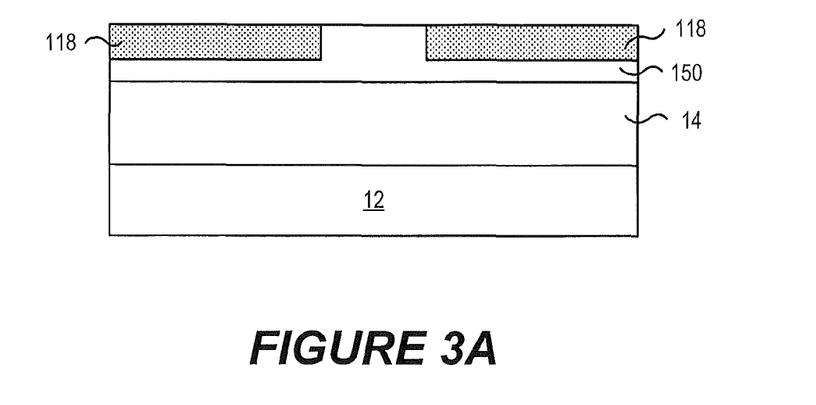
FIGS. 3A to 3E are cross sectional views illustrating the fabrication of a power MOSFET device according to further embodiments.

Referring to FIG. 3A, a substrate 12 is provided. The substrate 12 may be an off-axis SiC substrate having the 2H, 4H, 6H, 3C or 15R polytype. In particular embodiments, the substrate 12 may be an n+8° off-axis 4H SiC substrate.

A drift layer 14 is formed on the substrate 12. The drift layer 14 may have a thickness of about 6 μm to 10 μm, and may be doped with n-type dopants, such as nitrogen or phosphorus, at a doping concentration of about $2\times10^{14}$ $cm^{-3}$ to about $1\times10^{16}$ $cm^{-3}$. Other doping concentrations/voltage blocking ranges are also possible. In particular embodiments, the substrate may include a 4° off-axis 4H—SiC substrate and the drift layer may have a thickness of about 10 μm and may be doped with dopants at a doping concentration of about $8\times10^{15}$ $cm^{-3}$.

A current spreading layer 150 is formed on the drift layer. The current spreading layer may be doped with n-type dopants more heavily than the drift layer 14 to facilitate current spreading during forward operation. In particular embodiments, the current spreading layer may have a thickness of about 1.5 μm and may be doped with dopants at a doping concentration of about $2\times10^{16}$ $cm^{-3}$.

Still referring to FIG. 3A, well regions 118 may be formed in the current spreading layer 150 by low-energy implantation of p-type dopant ions, such as aluminum ions, into the drift layer 14. The p-type dopant ions may be implanted to have a uniform or non-uniform doping profile, such as a graded doping profile. The p-type dopant ions may be implanted at an implant energy of 200 keV and a dose of $1\times10^{15}$ $cm^{-2}$, such that the well regions 118 may have a doping concentration of about 1E18 $cm^{-3}$ to about 1E21 $cm^{-3}$.

Figure 3B:
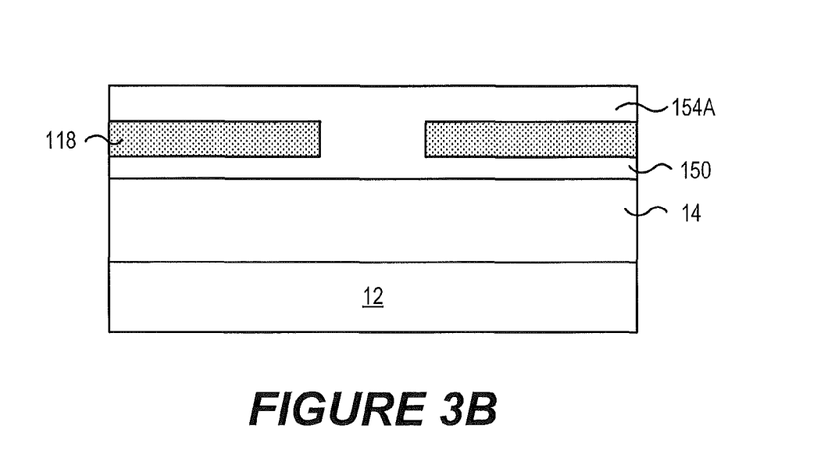

Referring to FIG. 3B, a JFET epitaxial layer 154A is formed on the current spreading layer 154A and over the well regions 118. The JFET epitaxial layer 154A may be doped with n-type dopants at a doping concentration of about $5\times10^{16}$ $cm^{-3}$, and may have a thickness of about 0.5 μm to about 1 μm.

Figure 3C:
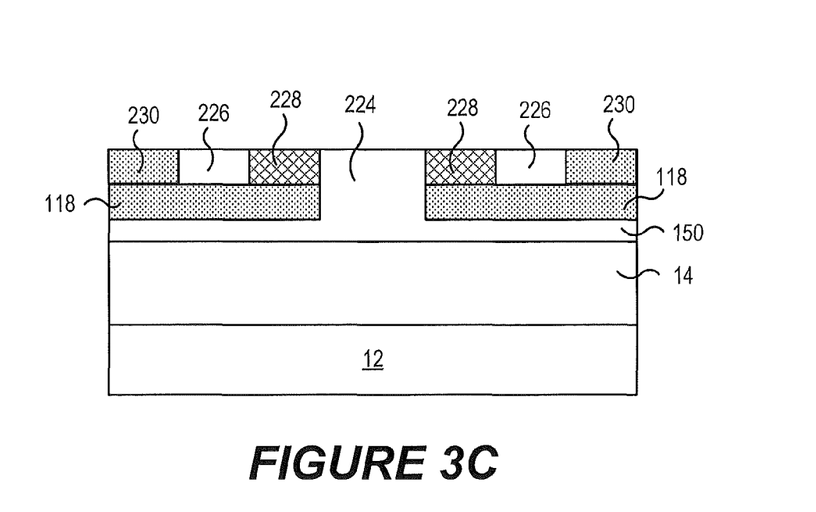

Referring to FIG. 3C, well contact regions 230, source regions 226 and body regions 228 are formed by ion implantation into the JFET epitaxial layer 154A.

The well contact regions 126 may be formed to extend into the well regions 118. The well contact regions 126 may be formed using a multiple implant profile including implants having a dose of $1\times10^{15}$ $cm^{-2}$ and an implant energy of from 200 to 300 keV, resulting in a doping concentration of about $1\times10^{18}$ to about $1\times10^{19}$ $cm^{-3}$.

The source regions 128 are formed above the well regions 118. The source regions 128 may be doped with n-type dopants at a doping concentration of about $1\times10^{18}$ $cm^{-3}$ to about $1\times10^{21}$ $cm^{-3}$. The source regions 128 may be formed by ion implantation. The doping profile in the source regions 128 may be uniform in some embodiments. In other embodiments, the doping profile in the source regions 128 may have a gradient and/or a delta doping profile.

The body regions 228 are formed in the JFET epitaxial layer 154A adjacent the source regions 226. The body regions 228 define a vertical conduction region 224 in the JFET epitaxial layer 154A.

That is, after implantation of the body regions 228, a vertical conduction region 224 remain in the structure between the body regions 228.

The implanted dopants may be activated as described above.

Figure 3D:
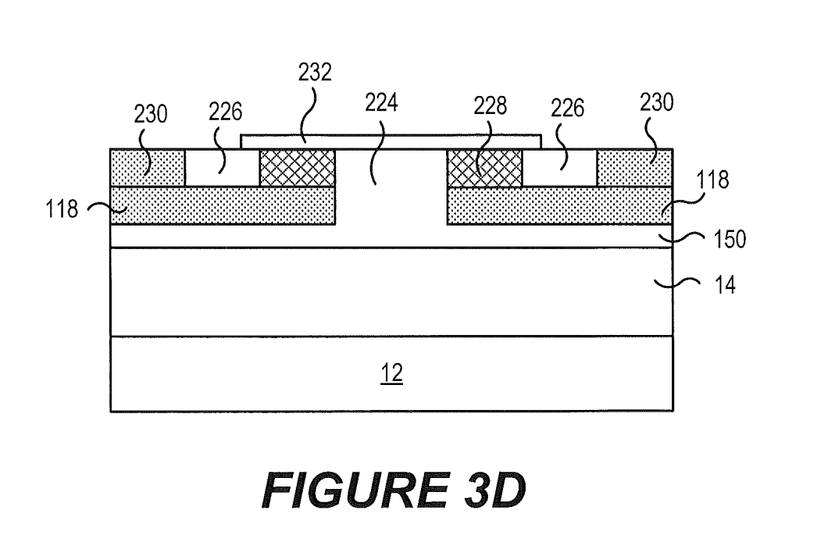

Referring to FIG. 3D, an n-type channel layer 232 may be formed over the body regions 228 and extending onto the source regions 226 by epitaxial regrowth. The n-type epitaxial channel layer 232 may have a thickness of about 0.05 μm to 0.2 μm and a doping concentration of about $1\times10^{15}$ $cm^{-3}$ to $1\times10^{17}$ $cm^{-3}$.

Figure 3E:
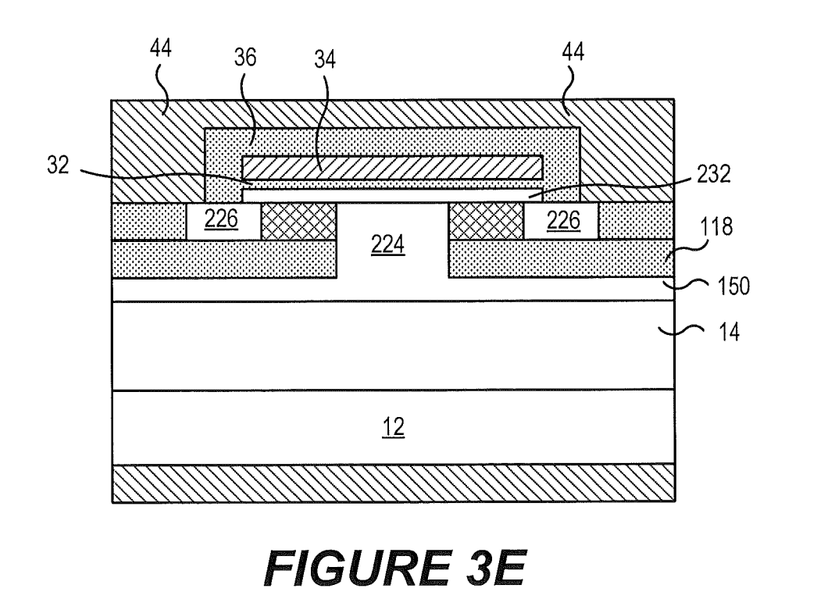

Referring to FIG. 3E, a gate insulator 32 is formed on the surface of the device over the channel layer 232 by a gate oxidation process, such as the gate oxidation process described above, with a final gate oxide thickness of 400-600 Å.

After formation of the gate insulator 32, a polysilicon gate 34 may be deposited on the gate insulator 32 and doped, for example, with boron or phosphorus. An interlayer insulation layer 36 of, for example, silicon oxide or silicon nitride is formed on the gate 34.

Ni may be deposited as the n-type source ohmic contact 44 and the drain ohmic contact 42. The contacts may be sintered in using a rapid thermal anneal process (RTA).

In the embodiments illustrated in FIGS. 3A-3E, the p-type body region 228 can be formed with a heavier doping concentration than the vertical conduction region 224. This may be beneficial for reducing the OFF state leakage current and increasing the blocking voltage.

It will be appreciated that although some embodiments of the invention have been described in connection with silicon carbide IGBT and MOSFET devices having n-type drift layers, the present invention is not limited thereto, and may be embodied in devices having p-type substrates and/or drift layers. Furthermore, the invention may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
    a drift layer having a first conductivity type, the drift layer having an upper surface;
    first regions in the drift layer and adjacent the upper surface thereof, the first regions having a second conductivity type that is opposite the first conductivity type and being spaced apart from one another;
    a body layer on the drift layer including the first regions, the body layer having the second conductivity type;
    spaced apart source regions in the body layer above respective ones of the first regions; and
    a vertical conduction region in the body layer between the source regions, the vertical conduction region having the first conductivity type and defining body regions in the body layer between the vertical conduction region and respective ones of the source regions;
    wherein the first regions are laterally spaced apart from one another by a first distance and the body regions are laterally spaced apart from one another by a second distance that is greater than the first distance.

2. The transistor device of claim 1, wherein the first regions are more heavily doped than the body layer.

3. The transistor device of claim 1, wherein the vertical conduction region is more heavily doped than the drift layer.

4. The transistor device of claim 1, further comprising:
    respective body contact regions extending through the body layer to the first regions, the body contact regions having the second conductivity type and being more heavily doped than the body layer.

5. The transistor device of claim 1, wherein the vertical conduction region extends through the body layer to the drift layer and contacts the first regions.

6. The transistor device of claim 5, further comprising a source contact that is in electrical contact with the vertical conduction region.

7. The transistor device of claim 1, further comprising a gate insulator on the body layer, wherein the body regions extend between and directly contact the gate insulator and the first regions.

* * * * *